INVENTOR
Joseph H. Scott, Jr.
BY Abraham Sherman
ATTORNEY

United States Patent Office 3,520,722

Patented July 14, 1970

3,520,722

FABRICATION OF SEMICONDUCTIVE DEVICES WITH SILICON NITRIDE COATINGS

Joseph H. Scott, Jr., Newark, N.J., assignor to RCA Corporation, a corporation of Delaware Filed May 10, 1967, Ser. No. 637,463
Int. Cl. B44d 1/18
U.S. Cl. 117—213 5 Claims

ABSTRACT OF THE DISCLOSURE

The interface instability of semiconductor devices having a silicon nitride coating on a surface of a semiconductive silicon body is eliminated by heating the body in a nitrogen-containing ambient such as ammonia prior to the deposition of the silicon nitride coating.

BACKGROUND OF THE INVENTION

Field of the invention

This invention relates to improved methods of fabricating improved semiconductive devices by depositing an insulating silicon nitride coating on a semiconductive substrate, and more particularly to the vapor deposition of a silicon nitride coating on a silicon substrate.

Description of the prior art

Thin films or layers of insulating material have been extensively used on the surface of crystalline semiconductive bodies to control the diffusion of a conductivity modifier into predetermined portions of the body; to protect the surface intercept of a PN junction within the semiconductive body; to serve as the dielectric in a capacitor; and to insulate electrically conductive paths and leads on the body surface. Preferably, the coating is made of a refractory material such as silicon oxide or silicon nitride, so that it is not injured by the high temperatures utilized in the fabrication of semiconductor devices.

It is known that insulating coatings can be deposited on substrates by heating the substrates in the mixed vapors of silane and ammonia maintained at temperatures about 750° C. to 1100° C. See for example, Electronics, Jan. 10, 1966, p. 164. The insulating coating thus deposited is believed to consist essentially of silicon nitride, $Si_3N_4$, formed by the reaction $$3SiH_4+4NH_3 \rightarrow Si_3N_4\downarrow+12H_2\uparrow$$

However, the conventional silicon nitride coatings deposited on silicon semiconductive bodies as described above result in an electrically unstable interface between the semiconductive body and the silicon nitride coating. The interface thus formed has a high density of energy states which act as charge carrier traps, and thus decrease the efficiency of semiconductor devices such as transistors and the like fabricated in this manner.

SUMMARY OF THE INVENTION

A crystalline semiconductive body such as monocrystalline silicon is first heated in a nitrogen-containing ambient such as ammonia, methylamine, ethylamine, nitrogen, hydrazine, or the like before depositing a silicon nitride coating on a surface of the body. According to one embodiment, the silicon nitrile coating step is performed in the same furnace tube as the heating step, so that the semiconductive body is protected from exposure to the atmosphere during the process.

DESCRIPTION OF THE PREFERRED EMBODIMENTS

Example I

Figure 1:
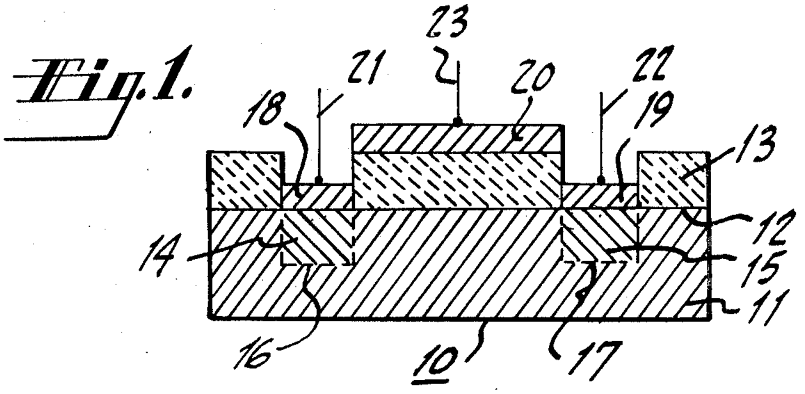
FIG. 1 is a cross-sectional view of a semiconductor device fabricated according to the invention.

A semiconductor device 10 (FIG. 1) comprises a crystalline semiconductive silicon body 11 having at least one major face 12. The precise size, shape and conductivity of body 11 is not critical. In this example, the semiconductive body 11 is about 40 mils square, about 6 mils thick, consists of monocrystalline silicon, and is of P type conductivity. The resistivity of semiconductive body 11 is preferably equal to or greater than 1 ohm-cm.

The crystalline semiconductive body 11 is positioned in a furnace tube (not shown). A nitrogen-containing gas such as ammonia or vaporized ammonia derivatives such as methylamine, dimethylamine, ethylamine, trimethylamine, hydrazine, or the like, is used to purge the furnace tube of air. An ambient of pure nitrogen may also be utilized. The semiconductive body 11 is heated in the nitrogen-containing ambient. In this example, the body 11 is suitably heated for about 60 minutes at a temperature of about 700° C. in an ambient consisting of ammonia. The heating period required varies inversely with the temperature. At 1200° C., heating for 10 minutes is sufficient. At 600° C., the heating period is preferably about 120 minutes.

On completion of this step, the semiconductive body 11 is maintained in the furnace tube in an oxygen-free ambient. A mixture of silane and ammonia is passed through the furnace tube, and the body 11 is heated in this mixture to a temperature of about 750° to 1100° C. A coating 13 which consists essentially of silicon nitride is thereby deposited on the surface of body 11.

Standard photolithographic techniques are utilized to form two spaced openings or apertures in the insulating coating 13. The semiconductive body 11 is now treated in the vapors of a conductivity modifier, which in this example is a donor such as arsenic or phosphorus, to form two spaced low resistivity N type regions 14 and 15 in the semiconductive body 11 immediately adjacent face 12 of the semiconductive body. To insure low resistivity in regions 14 and 15, diffusion is accomplished under such conditions of source concentration and heating profile that the concentration of charge carriers (electrons in this example) at the surface of regions 14 and 15 is at least $10^{19}$ per $cm.^3$. The remaining portions of the silicon nitride layer 13 act as a mask against diffusion of the donor. PN junctions 16 and 17 are formed at the boundary between the N type diffused regions 14 and 15 respectively and the P type bulk of the semiconductive body 11. The two N type regions 14 and 15 will correspond in size and shape at the two apertures formed in the silicon nitride coating 13. Preferably, the space between regions 14 and 15 should be less than 1 mil. In this example, the two donor-diffused low resistivity regions 14 and 15 are 10 mils long, 3 mils wide, and 0.1 mil thick. The two regions 14 and 15 are separated along the 10-mil length by a gap or space of about 0.2 mil.

A metal such as aluminum, palladium, chromium, or the like is deposited by any convenient method, for example by evaporation through a mask, on the exposed portions of N type regions 14 and 15, and also on a portion of the insulating coating 13 over the gap or space between regions 14 and 15. One metallic contact 18 is thus formed to region 14, another metallic contact 19 is formed to region 15, and a third metallic contact 20 on the silicon nitride layer 13 over the gap between regions 14 and 15. In operation, contacts 18 and 19 serve as the source and drain electrodes, while contact 20 serves as the control or gate electrode of the device. Electrodes 21, 22 and 23 are attached to electrodes 18, 19 and 20 respectively. The unit may be encapsulated and cased by standard methods known to the semiconductor art. The device of this example may be operated as an enhancement type insulated gate field effect transistor as described in Wallmark and Johnson, Field Effect Transistors, Prentiss-Hall, Inc., Englewood Cliffs, N.J., 1966.

Figure 2:
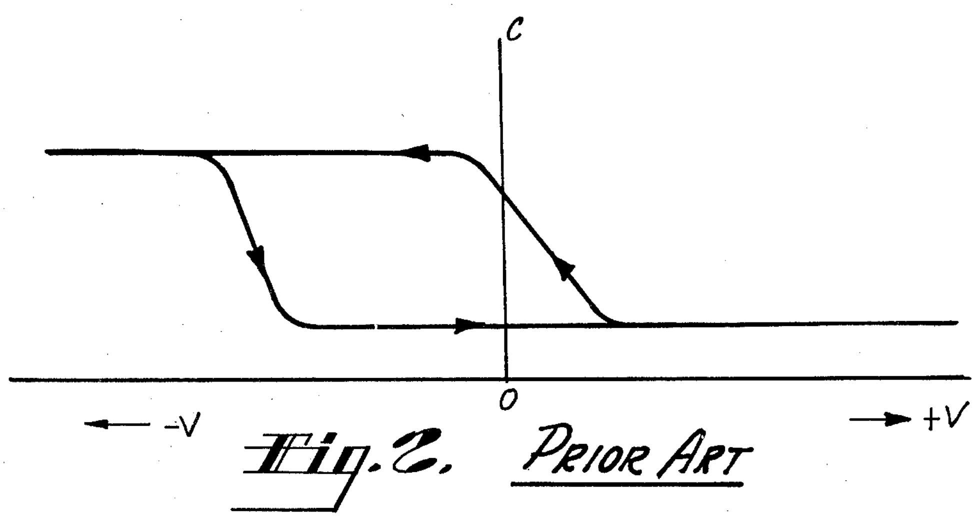
Fig. 2. PRIOR ART
FIG. 2 is a graph showing the variation in capacitance with applied voltage for a test body comprising a silicon nitride coating on a crystalline semiconductive silicon body according to the prior art.

The improved electrical stability of the silicon-silicon nitride interface in the device thus fabricated is demonstrated by comparing plots of capacitance versus voltage for a monocrystalline silicon body having a silicon nitride coating according to the prior art on one surface of the body, and for a comparable silicon body having a silicon nitride coating according to this embodiment on one surface. One electrode is positioned on the silicon nitride coating; another electrode is positioned on that face of the silicon body which is opposite the coating; a direct current source such as a battery is used to apply a voltage between the two electrodes across the silicon-silicon nitride interface; and the capacitance across the interface is measured. FIG. 2 shows the variation in capacitance with voltage in normalized units for a silicon body having a silicon nitride coating deposited on one surface of the body according to the prior art. The C-V curve in FIG. 2 has a pronounced hysteresis loop.

Figure 3:
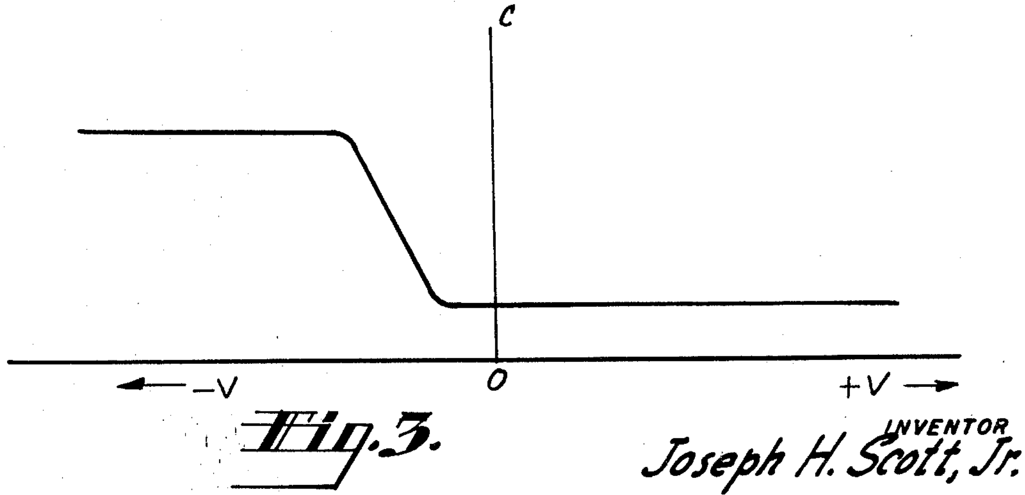
FIG. 3 is a graph showing the variation in capacitance with applied voltage for a test body comprising a silicon nitride coating deposited on a crystalline semi-conductive silicon body according to the invention.

For comparison, FIG. 3 shows the variation in capacitance with voltage for a comparable monocrystalline silicon body having a comparable silicon nitride coating deposited on a surface of the body, wherein the body has been heated in ammonia at about 700° C. for about 60 minutes prior to the deposition of the silicon nitride coating. The C-V curve in FIG. 3 does not exhibit any noticeable hysteresis loop.

Example II

A semiconductor device 10 (FIG. 1) is prepared as described in Example I above, but the conductivity of the various device regions is reversed. In this example, the semiconductive body 11 consists of N conductivity type silicon, and is heated in a furnace tube containing an ambient of methylamine vapors for about 120 minutes at about 600° C. The semiconductive body 11 is then heated in a mixture of silane and ammonia to deposit the silicon nitride coating 13.

Two spaced apertures are made in the silicon nitride coating 13. The silicon body 11 is then heated in the vapors of an acceptor such as boron trioxide to form two spaced low resistivity P type conductivity regions 14 and 15, and two PN junctions 16 and 17 at the resistive boundaries between the diffused regions 14 and 15 and the bulk of silicon body 11. The remaining steps of depositing the device electrodes 18, 19 and 20, and attaching electrical leads 21, 22 and 23 respectively to the device electrodes, are performed as described above in connection with Example I. The device thus fabricated is also an insulated-gate field-effect transistor, but the conductivity type of the various regions is reversed as compared with the device of Example I.

The above examples are by way of illustration only, and not by way of limitation. Other semiconductive devices such as diodes, bipolar triode transistors, and thyristor devices such as controlled silicon rectifiers and bi-directional silicon switches may be similarly provided with an electrically stable silicon-silicon nitride interface. Nitrogen and other nitrogen-containing ambients may be utilized. Various other modifications may be made by those skilled in the art without departing from the spirit and scope of the invention as set forth in the specification and the appended claims.

I claim:

1. The method of fabricating a semiconductor device having a silicon nitride coating deposited on at least one surface of a crystalline silicon body, comprising heating said body to a temperature of about 600° to 1200° C. in an ambient consisting substantially of nitrogen or a vaporized nitrogen-containing compound prior to the deposition of said silicon nitrde coating on said silcon body, whereby to minimize the instability of the interface between said body and said coating.

2. The method as in claim 1, wherein said ambient is selected from the group consisting of ammonia and vaporized ammonia derivatives.

3. The method as in claim 1, wherein said silicon body is heated in said ambient for about 10 to 120 minutes prior to the deposition of said silicon nitride coating from the vapor phase on said body.

4. The method of fabricating a semiconductor device comprising a silicon nitride coating deposited on at least one surface of a crystalline silicon body, comprising heating said silicon body in an ambient of ammonia vapors at about 700° C. for about 60 minutes, and then depositing a silicon nitride coating from the vapor phase on said body.

5. The method of forming a stable silicon-silicon nitride interface in a semiconductive device, comprising (a) positioning a crystalline silicon body in a furnace tube;

(b) heating said body in said furnace tube at a temperature of about 600° to 1200° C. in an ambient consisting substantially of a vaporized nitrogen-containing compound;

(c) maintaining said body in said furnace tube in an oxygen-free ambient; and (d) heating said body in said furnace tube in the mixed vapors of silane and ammonia to deposit a silicon nitride coating on said body.

References Cited

UNITED STATES PATENTS

| | | | |
|---|---|---|---|
| 3,149,398 | 9/1964 | Sprague et al. | |
| 3,200,015 | 10/1965 | Kuntz | 148—6.3 |
| 3,246,214 | 4/1966 | Hugle | 317—235 |
| 3,422,321 | 1/1969 | Tombs | 317—235 |

FOREIGN PATENTS

| | | |
|---|---|---|
| 1,190,308 | 3/1959 | France. |

OTHER REFERENCES

O. Glemser, K. Beltz, P. Naumann, The Silicon-Nitrogen System, in Chemical Abstracts, 52; 2629b, 1958.

Semiconductor Device, in Chemical Abstracts 63; 1321h, 1965.

ALFRED L. LEAVITT, Primary Examiner

C. F. WEIFFENBACH, Assistant Examiner

U.S. Cl. X.R.

117—106, 229